(12) United States Patent
Kim et al.

(10) Patent No.: US 8,545,731 B2
(45) Date of Patent: Oct. 1, 2013

(54) CONDUCTIVE PASTE AND CONDUCTIVE CIRCUIT BOARD PRODUCED THEREWITH

(75) Inventors: Yoon-Jin Kim, Gunpo-si (KR); Chang-Mo Ko, Gwangmyeon-si (KR); Ho-Souk Cho, Seoul (KR)

(73) Assignee: LS Cable & System, Ltd, Anyang (KR)

( * ) Notice: Subject to any disclaimer, the term of this patent is extended or adjusted under 35 U.S.C. 154(b) by 0 days.

(21) Appl. No.: 13/155,367

(22) Filed: Jun. 7, 2011

(65) Prior Publication Data

US 2011/0260115 A1  Oct. 27, 2011

Related U.S. Application Data

(63) Continuation of application No. PCT/KR2009/005371, filed on Sep. 22, 2009.

(30) Foreign Application Priority Data

Dec. 10, 2008 (KR) ................. 10-2008-0125247

(51) Int. Cl.
- *H01B 1/04* (2006.01)
- *H01B 1/22* (2006.01)
- *H01B 1/02* (2006.01)
- *H05K 1/00* (2006.01)

(52) U.S. Cl.
USPC ........... 252/503; 252/502; 252/514; 977/742; 977/773; 174/250

(58) Field of Classification Search
USPC ................. 252/500, 502, 503, 514; 977/742, 977/773; 174/250
See application file for complete search history.

(56) References Cited

U.S. PATENT DOCUMENTS

| 2005/0231091 A1* | 10/2005 | Bouchard et al. ............. 313/311 |
| 2008/0252195 A1* | 10/2008 | Liu et al. ....................... 313/496 |

FOREIGN PATENT DOCUMENTS

| JP | 2004 168966 | * | 6/2004 |
| JP | 2006-140206 | | 6/2006 |
| JP | 2007-149522 | | 6/2007 |
| JP | 2007149522 | * | 6/2007 |
| KR | 10-2007-0059914 | | 6/2007 |
| KR | 10-2008-0078397 | | 8/2008 |

OTHER PUBLICATIONS

Qin et al. Preparation and field emission properties of carbon nanotubes cold cathode using metling Ag nano-particles as binder. Applied Surface Science, 253, 2007, 4021-4024.*

* cited by examiner

*Primary Examiner* — Harold Pyon
*Assistant Examiner* — Tanisha Diggs
(74) *Attorney, Agent, or Firm* — NSIP Law

(57) ABSTRACT

A conductive paste containing silver nanoparticles and a conductive circuit board provided therewith are provided. The conductive paste containing silver nanoparticles includes 15 to 50 weight % of silver nanoparticles based on a total weight of the conductive paste, the silver nanoparticles having an average particle size of 1 to 100 nm; 0.1 to 2.5 weight % of carbon nanotubes based on the total weight of the conductive paste, the carbon nanotubes having an average diameter of 2 to 40 nm; 1 to 15 weight % of a binder based on the total weight of the conductive paste; and a solvent.

5 Claims, 3 Drawing Sheets

CONDUCTIVE PASTE AND CONDUCTIVE CIRCUIT BOARD PRODUCED THEREWITH

CROSS-REFERENCE TO RELATED APPLICATION

This application is a continuation application of International Application PCT/KR2009/005371, filed on Sep. 22, 2009, which claims the benefit of Korean Patent Application No. 10-2008-0125247, filed on Dec. 10, 2008, the entire disclosure of which is incorporated herein by reference for all purposes.

BACKGROUND

1. Field

The following description relates to a conductive paste or ink containing silver nanoparticles, and a conductive circuit board having a circuit wire formed using the paste or ink.

2. Description of Related Art

Information communication devices, such as liquid crystal displays, are becoming more miniaturized with higher performance. Attempts have been steadily made to incorporate these devices on flexible material supports. The circuit wire of the devices is generally formed by forming a film by vapor deposition such as chemical vapor deposition (CVD), sputtering and so on, and etching out an unnecessary portion by photolithography and so on.

However, the conventional method for forming a circuit wire has disadvantages caused by repetition of film formation and etching, such as a low usage efficiency of raw materials, generation of a large amount of waste, a long manufacturing time, and a considerable installation cost. Further, the conventional method encounters many difficulties in forming a fine circuit wire required for miniaturization of the aforementioned devices.

To solve the above-referenced issues, recently, the related industries have been focusing on ink-jet printing or a roll printing. These printing techniques allow a low loss of raw materials, non-use of hazardous components such as lead or the like, and a simple process for forming a circuit wire. More than anything else, these techniques support formation of a thinner and finer circuit wire than the conventional techniques. However, to form a circuit wire by said techniques, development of a high-performance conductive paste or ink is needed.

A conductive ink suitable for forming a circuit wire should have a specific resistivity of $1 \times 10^{-5}$ Ω·cm or less for a high conductivity. However, it is not preferable to use a costly conductive filler so as to achieve said specific resistivity.

Further, when printing the conductive paste on a flexible circuit board material such as polyethylene terephthalate (PET) and so on, a sufficiently low sintering temperature is important, because plastics or the like have a low glass transition temperature ($T_g$). The sintering temperature is set depending on the characteristics of a conductive filler (generally metal particles) and other components of the conductive paste. However, as the smaller metal particles have higher surface energy, the sintering temperature tends to be even less than an intrinsic melting point of a metal.

Silver has a high conductivity, and, thus, is suitable as a conductive filler of a conductive paste for forming a fine circuit wire. However, the use of a large amount of silver increases cost. Further, silver has a poor adhesion with a widely utilized circuit board material and a difficulty in forming a smooth circuit wire.

In addition, silver cannot achieve both a low sintering temperature and a low cost at the same time. It is preferred to use silver having a particle size of nanometer or smaller level so as to lower the sintering temperature of the conductive paste. However, in this case, it requires more cost than the use of silver having a particle size of micrometer or larger level. Conventionally, silver was used at an amount of 50 weight % or more or 80 weight % or more to the maximum based on the weight of the conductive paste so as to attain a desired level of conductivity of the conductive paste. If the content of silver does not come up to the range, a gap is created between silver particles, so that the silver particles are not electrically connected. Although there are electrical contacts between silver particles, the number of electrical contacts is very small, causing insufficient conductivity. In the case of screen printing, it is easy to control the viscosity of the conductive paste having a high content of silver to a suitable level for spray through a mesh net. However, a high content of silver nanoparticles having a high tendency to agglomerate increases cost, and needs an additive such as a dispersant, a stabilizer or the like, to ensure storage stability of the conductive paste. Because the additive generally has a high molecular weight of 10,000 or more, the use of the additive increases the sintering temperature again. That is, the sintering temperature reduction effect obtained by reducing the particle size of silver is minimalized due to the increased silver content for a high conductivity.

For these reasons, the conventional conductive paste containing silver uses a high concentration of silver to form a continuous electrical network, thereby lowering a specific resistivity down to $1 \times 10^{-5}$ Ω·cm or less. And, when the particle size of silver is 20 nm or less (level of silver nanoparticles), the conventional conductive paste has a minimum limit of sintering temperature of about 150° C. In summary, the conventional conductive paste has the limited particle size of silver to achieve a low sintering temperature and a high electrical conductivity. And, a large amount of silver having a particle size of a predetermined level or smaller causes side effects of a cost rise and a high sintering temperature resulted from the use of an additive such as a stabilizer. Under these circumstances, there is still a demand for a conductive paste that solves the problems and has a good adhesion with a circuit board material and a suitable viscosity for printing.

SUMMARY

In one general aspect, there is provided a conductive paste containing silver nanoparticles, including 15 to 50 weight % of silver nanoparticles based on a total weight of the conductive paste, the silver nanoparticles having an average particle size of 1 to 100 nm; 0.1 to 2.5 weight % of carbon nanotubes based on the total weight of the conductive paste, the carbon nanotubes having an average diameter of 2 to 40 nm; 1 to 15 weight % of a binder based on the total weight of the conductive paste; and a solvent.

The general aspect of the conductive paste containing silver nanoparticles may further provide 0.1 to 10 weight % of at least one additive based on the total weight of the conductive paste, the at least one additive being selected from the group consisting of a stabilizer, a dispersant, a reducing agent, a surfactant, a wetting agent, a thixotropic agent, a leveling agent, an antifoaming agent, a coupling agent, a surface tension adjusting agent and a thickener.

The general aspect of the conductive paste containing silver nanoparticles may further provide that the conductive paste has a sintering temperature of 150° C. or less.

The general aspect of the conductive paste containing silver nanoparticles may further provide that the conductive paste has a specific resistivity of $2 \times 10^{-6}$ to $10 \times 10^{-6}$ Ω·cm.

The general aspect of the conductive paste containing silver nanoparticles may further provide that the carbon nanotubes have an average length of 5 to 50 μm.

The general aspect of the conductive paste containing silver nanoparticles may further provide that the carbon nanotubes are included at an amount of 0.5 to 1 weight % based on the total weight of the conductive paste.

The general aspect of the conductive paste containing silver nanoparticles may further provide that the binder is selected from the group consisting of nitrocellulose, acrylic resin, vinylic resin, ethylcellulose and modified resins thereof.

In another general aspect, there is provided a conductive paste containing silver nanoparticles, including 1 to 10 weight % of silver nanoparticles based on a total weight of the conductive paste, the silver nanoparticles having an average particle size of 1 to 100 nm; 30 to 60 weight % of silver microparticles based on the total weight of the conductive paste, the silver microparticles having an average particle size greater than 0.1 and not greater than 50 μm; 0.1 to 1 weight % of carbon nanotubes based on the total weight of the conductive paste, the carbon nanotubes having an average diameter of 2 to 40 nm; 1 to 15 weight % of a binder based on the total weight of the conductive paste; and a solvent.

The other general aspect of the conductive paste containing silver nanoparticles may further provide 0.1 to 10 weight % of at least one additive based on the total weight of the conductive paste, the at least one additive being selected from the group consisting of a stabilizer, a dispersant, a reducing agent, a surfactant, a wetting agent, a thixotropic agent, a leveling agent, an antifoaming agent, a coupling agent, a surface tension adjusting agent and a thickener.

The other general aspect of the conductive paste containing silver nanoparticles may further provide that the conductive paste has a sintering temperature of 150° C. or less.

The other general aspect of the conductive paste containing silver nanoparticles may further provide that the conductive paste has a specific resistivity of $2 \times 10^{-6}$ to $10 \times 10^{-6}$ μm.

The other general aspect of the conductive paste containing silver nanoparticles may further provide that the carbon nanotubes have an average length of 5 to 50 μm.

A conductive circuit board may be provided having a circuit wire formed from the conductive paste defined of the general aspect or the other general aspect.

The general aspect of the conductive paste containing silver nanoparticles including the at least one additive may further provide that the conductive paste has a sintering temperature of 150° C. or less.

The general aspect of the conductive paste containing silver nanoparticles including the at least one additive may further provide that the conductive paste has a specific resistivity of $2 \times 10^{-6}$ to $10 \times 10^{-6}$ Ω·cm.

The general aspect of the conductive paste containing silver nanoparticles including the at least one additive may further provide that the carbon nanotubes have an average length of 5 to 50 μm.

The other general aspect of the conductive paste containing silver nanoparticles including the at least one additive may further provide that the conductive paste has a sintering temperature of 150° C. or less.

The other general aspect of the conductive paste containing silver nanoparticles including the at least one additive may further provide that the conductive paste has a specific resistivity of $2 \times 10^{-6}$ to $10 \times 10^{-6}$ Ω·cm.

The other general aspect of the conductive paste containing silver nanoparticles including the at least one additive may further provide that the carbon nanotubes have an average length of 5 to 50 μm.

Other features and aspects may be apparent from the following detailed description, the drawings, and the claims.

Figure 1:
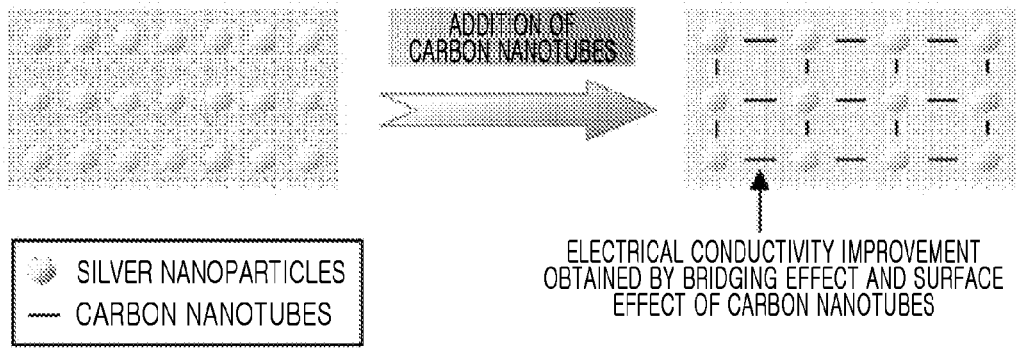
FIG. 1 is a view illustrating an example of the principle that carbon nanotubes electrically connect silver nanoparticles serving as a sole conductor in a conductive paste to significantly improve an electrical conductivity.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

A conductive paste of an example embodiment includes 15 to 50 weight % of silver nanoparticles having an average particle size of 1 to 100 nm, 0.1 to 2.5 weight % of carbon nanotubes having an average diameter of 2 to 40 nm, 1 to 15 weight % of a binder, based on the total weight of the conductive paste, and a solvent. The conductive paste may further include an additive. The conductive paste may be sintered at a low temperature of 150° C. or less.

The silver nanoparticles have an average particle size of 1 to 100 nm. If the average particle size of the silver nanoparticles is less than 1 nm, the conductive paste has a very low viscosity, which makes it difficult to form a circuit board having a certain thickness or larger. However, the silver nanoparticles do not need to have an average particle size of 20 nm or less for a high conductivity and a low sintering temperature. Further, the silver nanoparticles are not limited to specific shape. The silver nanoparticles may have a shape of, for example, sphere, flake and so on.

Configurations containing carbon nanotubes may attain both a low sintering temperature and a high electrical conductivity at the same time. Effects in aspects of cost and storage stability may be better with larger silver nanoparticles. For example, the silver nanoparticles have an average diameter in a range of 20 nm to 100 nm. The silver nanoparticles used in the conductive paste may be used without coating or surface modification, or surface-modified for hydrophilic or hydrophobic property or surface-coated with a coating material such as a protective colloid forming material and so on.

For example, the silver nanoparticles are included at an amount of 15 to 50 weight % based on the total weight of the conductive paste. This content is lower than that of conventional pastes, and may result in both a high electrical conductivity and cost reduction. If the content of silver nanoparticles is less than 15 weight %, the conductive paste may have poor electrical contact between silver nanoparticles, resulting in a large resistivity. If the content of silver nanoparticles is greater than 50 weight %, an improvement in conductivity to cost rise may be insignificant.

In the conductive paste, the carbon nanotubes establish an electrical connection between the silver particles or are attached to the surface of the silver particles to substantially increase the surface area of the silver particles. Accordingly, the carbon nanotubes may reduce the silver content required to achieve the same level of conductivity due to their bridging effect. Further, the carbon nanotubes may allow use of silver nanoparticles having a particle size of 20 nm or greater without a sacrifice of sintering temperature of the conductive paste. In addition, the carbon nanotubes may improve adhesion with a circuit board material and facilitates to control the viscosity of the conductive paste to a suitable level for printing.

The aforementioned features may be naturally obtained by the reduced amount of an inorganic substance as a filler occupying the conductive paste. For example, the typical carbon nanotube has some extent of surface defects in a graphene sheet. Thus, a functional group, such as a carboxyl group and so on, protrudes from the surface of the defects in the manufacture. Because the typical carbon nanotubes contain the functional group, it is possible to increase the adhesion of the conductive paste to the surface of the circuit board, which is not intended to be tied to a specific theory.

In an example embodiment, the content of the carbon nanotubes is selected in consideration of a target electrical conductivity, the content of silver nanoparticles and so on. A study of the relationship between electrical conductivity and the content of carbon nanotubes may help to set a proper content of carbon nanotubes in the conductive paste. A conductive paste containing solely multiwalled carbon nanotubes has an electrical conductivity for direct current (DC) represented as the following percolation formula. That is, DC conductivity increases in an exponential proportion to a difference between a reference content (percolation point) and the CNT content that is higher than the reference content.

Percolation Formula $$\sigma_{DC}=\sigma_0(P-P_c)^t \text{ (in case of } P>P_c)$$

where $\sigma_{DC}$ is DC conductivity, and 't' is an experimentally determined value. 'P' is a volume fraction of multi-walled carbon nanotubes, $\sigma_0$ is a proportional factor, and $P_c$ is a percolation content (a threshold value for electrical connection; for example, if the CNT content is greater than the percolation content, DC conductivity changes with a small change in CNT content).

Figure 2:
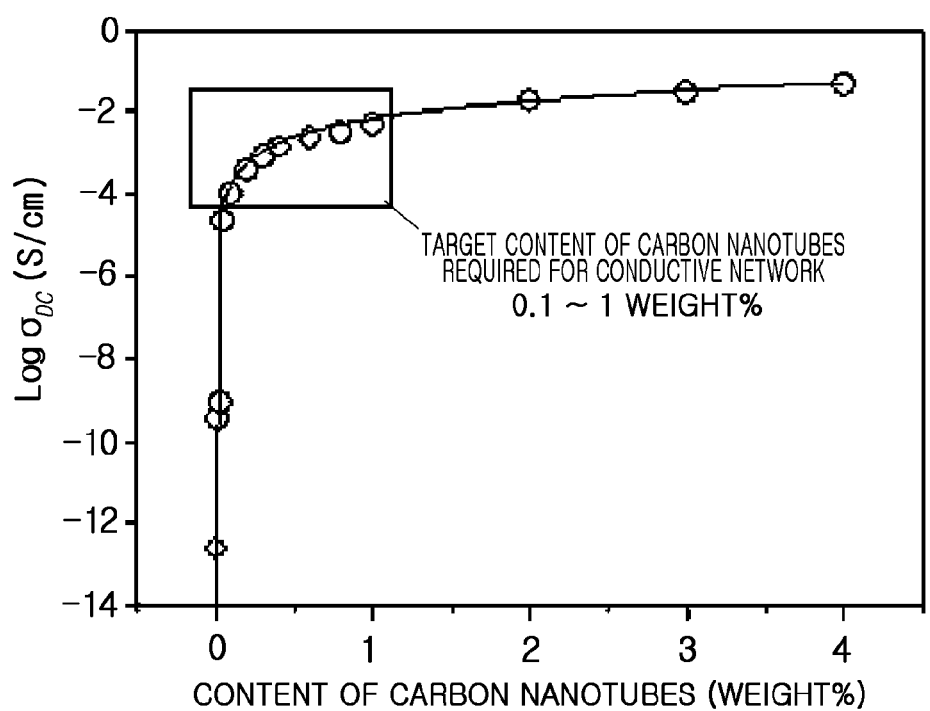
FIG. 2 is a graph illustrating an example of the relationship between the content of carbon nanotubes and electric conductivity and indicating a percolation point of a conductive paste containing solely carbon nanotubes.

FIG. 2 is a graph illustrating an example of the relationship between the CNT content (weight %) and a common logarithm value of electrical conductivity (S/cm) in a conductive paste (hereinafter referred to as a conductive paste of an experimental example) containing solely multiwalled carbon nanotubes as a conductor without silver particles. This conductive paste of the experimental example uses polyurethane as a binder, and is hot-pressed using a hot press to manufacture a paste specimen. The conductive paste of the experimental example is not sintered when heated. That is, volatile components, such as a solvent and so on, are just removed from the conductive paste.

It is found from FIG. 2 that it is difficult to obtain a high electrical conductivity of a desired level with solely carbon nanotubes (CNT) as a conductive filler, but that it is possible to form a continuous electrical network with a very low content of carbon nanotubes. As shown in FIG. 2, DC conductivity to CNT content increases most greatly around the fourth data point. Further, in the CNT content range of 1 weight % or more, an increase in DC conductivity is insignificant even though the CNT content increases.

From the graph of FIG. 2, the percolation content $P_c$ of carbon nanotubes is determined to 0.0089 weight %, and a point where the electrical conductivity starts to be saturated due to the increased CNT content is about 0.1 to 1 weight % of carbon nanotubes (indicated as a box in FIG. 2). In the percolation formula of the conductive paste of the experimental example, the proportional factor $\sigma_0$ is $5.9\times10^{-3}$ S/cm. Theoretically, the proportional factor should be equal to a value of carbon nanotube mat (a similar value to conductivity of copper). Actually, however, the proportional factor is much smaller than a value of carbon nanotube mat, as is shown in FIG. 2. It is considered that, in the conductive paste of the experimental example, a resistivity is not lowered down to a value of carbon nanotube mat because a continuous network is not formed and the gap is created between the carbon nanotubes, which is not intended to be tied to a specific theory.

Judging from the experimental data, examples and so on, in the conductive paste (not containing silver microparticles), the content of carbon nanotubes is preferably 0.1 to 2.5 weight % based on the total weight of the conductive paste. If the content of carbon nanotubes is less than 0.1 weight %, the electrical conductivity improvement effect may not be exhibited. If the content of carbon nanotubes is greater than 2.5 weight %, because the electrical conductivity of carbon nanotubes is less than that of silver particles, the electrical conductivity improvement effect may reach a saturation point. For example, the content of carbon nanotubes is 0.5 to 1 weight % in consideration of viscosity, manufacturing cost, conductivity of the conductive paste, and so on.

The conductive paste may use both single-walled nanotubes (SWNT) and multi-walled nanotubes (MWNT) as carbon nanotubes. Further, the conductive paste may use carbon nanotubes of which the surface is modified by various functional groups. The conductive paste may use carbon nanotubes produced by thermal chemical vapor deposition, arc discharge and so on. For example, the carbon nanotubes have a diameter of 2 to 40 nm. Taking into consideration that silver nanoparticles have a particle size of 1 to 100 nm and silver flake-type particles have a density of 10.5 g/cm$^3$, the carbon nanotubes have a length of 5 to 50 μm to effectively fill up the gap between silver particles.

The conductive paste includes 5 to 15 weight % of a binder and a proper content of a solvent. Moreover, the conductive paste may further include an additive. For example, the binder may include nitrocellulose, ethyl cellulose, acrylate, acrylate copolymer, polyvinyl-based resin and modified resins thereof. The solvent and the additive may be properly selected from all typical solvents and additives depending on the desired end-use properties. For example, the additive may be at least one selected from the group consisting of a stabilizer, a dispersant, a reducing agent, a surfactant, a wetting agent, a thixotropic agent, a leveling agent, an antifoaming agent, a coupling agent, a surface tension adjusting agent and a thickener, and be included at an amount of 0.1 to 10 weight %.

According to another aspect, a conductive paste contains carbon nanotubes and a silver particle mixture having particle sizes of nanometer and micrometer levels. Silver particles having a micrometer level of particle size are hereinafter referred to as silver microparticles. The conductive paste includes 1 to 10 weight % of silver nanoparticles having an average particles size of 1 to 100 nm, 30 to 60 weight % of silver microparticles having an average particle size greater than 0.1 μm and not greater than 50 μm, 0.1 to 1 weight % of carbon nanotubes having an average diameter of 2 to 40 nm, 1 to 15 weight % of a binder, based on the total weight of the conductive paste, and a solvent. For example, the conductive paste may further include an additive. The conductive paste may be sintered at a low temperature of 150° C. or less.

It has been said that silver microparticles may be more advantageous than silver nanoparticles in aspects of paste manufacturing cost and handling and storage stability of particles. However, silver microparticles may cause an increase in sintering temperature of the conductive paste, and consequently cause a decrease in process efficiency. Generally, a silver paste including solely silver flake-type particles having a micrometer level of particle size are sintered to form a continuous electrical network for a desired specific resistivity, when heated at 550 to 700° C. for 30 minutes or greater. Accordingly, to sinter the silver paste at a low temperature, silver particles should have a small particle size. A conductive paste containing silver nanoparticles, silver microparticles and carbon nanotubes at a proper ratio may have a low sintering temperature due to the silver nanoparticles, a cost reduction due to the silver microparticles, and an improvement in electrical conductivity and a rise in cost reduction due to the carbon nanotubes, resulting in the conductive paste containing silver microparticles of the example embodiment.

The conductive paste containing silver microparticles may have the same constituent components other than the silver microparticles as the conductive paste containing silver nanoparticles. In the conductive paste containing silver microparticles, the content of silver microparticles is 30 to 60 weight %. If the content of silver microparticles is less than 30 weight %, an imperfect electrical network may be formed, causing a reduction in electrical conductivity. If the content of silver microparticles is greater than 60 weight %, the effect of silver microparticles on silver nanoparticles may be reduced.

According to yet another aspect, a conductive circuit board having a circuit wire formed using the conductive paste is provided. A method of fabricating a conductive circuit board is described in brief. A circuit wire is formed by printing the conductive paste on a circuit board made of metal, glass, plastic and so on, by ink jet, spin coating, screen printing and so on. At this time, the circuit wire is formed on a base film that is formed on the surface of the circuit board. The base film of the circuit board may have a circuit pattern scanned thereon in advance by photolithography or screen printing. The conductive paste is sprayed in conformity with the scanned circuit pattern to form a film including a conductive filler. Subsequently, the circuit board having the conductive paste printed thereon is sintered to remove a solvent and so on, and fuse silver particles. If necessary, a multilayered circuit board may be fabricated through subsequent processes.

Hereinafter, examples and an example of a production method are provided. Conductive pastes of examples and conductive pastes of comparative examples were prepared, and their performance was compared. Methods for preparing the conductive pastes of examples and comparative examples are described below.

EXAMPLE 1

Paste Containing Silver Nanoparticles and Carbon Nanotubes 5 g of spherical silver nanoparticles (produced by LS Corp.) having a particle size of 5 to 40 nm, 25 g butyl acetate solution containing nitrocellulose (produced by Korea CnC Co., Ltd., HS ½, the solid content of nitrocellulose is 4 g) as a binder, 10 g dispersion containing a propylene glycol methyl ether acetate (PGMA) solvent and carbon nanotubes (the content of carbon nanotubes is 10%, i.e., 1 g, multi-walled, 10 nm diameter, tens of μm length, modification and high-temperature thermal treatment, provided by Korea University), and 60 g silver flake-type microparticles of which $D_{50}$ is 3 μm, were preliminarily mixed and then mix-milled using a three roll mill, so that the silver particles and the carbon nanotubes were sufficiently dispersed. Next, the resultant paste was printed on a PET substrate at a size of 5×5 cm by screen printing using Poly420 (420 meshes). The substrate was sintered at 150° C. for 10 minutes in a convection oven to manufacture a specimen.

EXAMPLE 2

Paste Containing Silver Nanoparticles and Carbon Nanotubes

Figure 3:
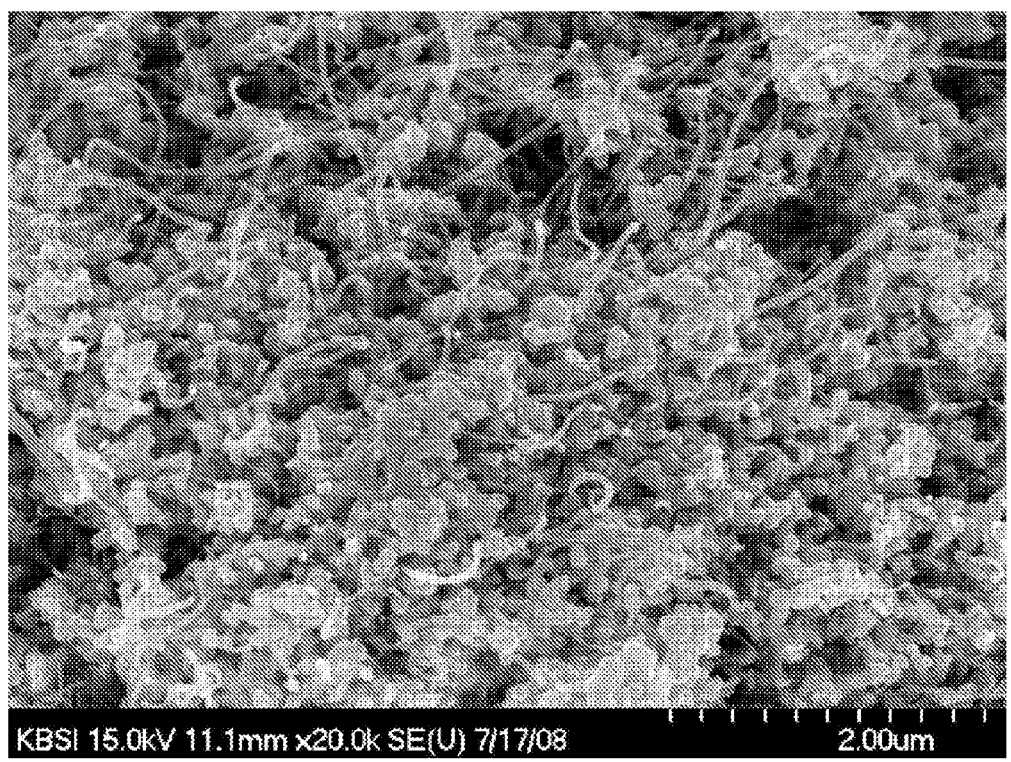
FIG. 3 is an SEM cross-sectional image illustrating an example of a circuit electrode formed according to example 2, in which an electrical network having carbon nanotubes distributed between silver nanoparticles is formed.
Figure 4:
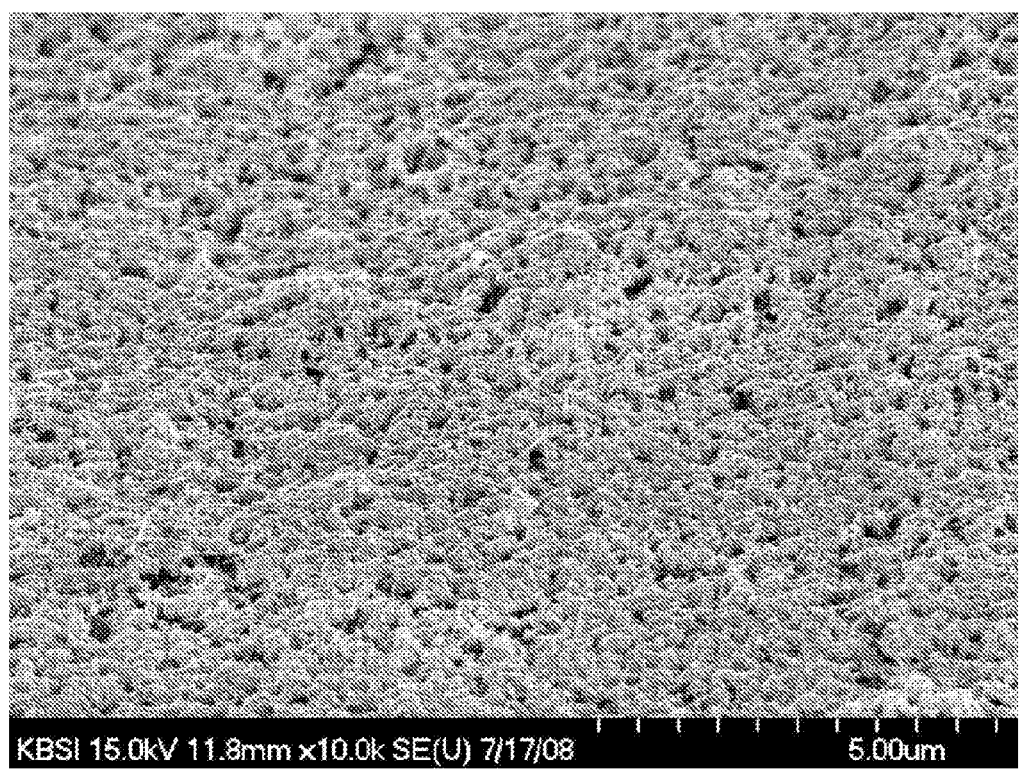
FIG. 4 is an SEM surface image illustrating an example of a circuit electrode formed according to example 2, in which metallization is accomplished after sintering.

An Ag—CNT paste was prepared in the same way as example 1, except that 10 g of silver nanoparticles, 8 g of butyl acetate solution containing nitrocellulose (the solid content of nitrocellulose is 2.4 g), 1 g of carbon nanotubes and 58 g of silver microparticles were used, and 23 g of butyl carbitol acetate (BCA) was added. A substrate was sintered at 140° C. for 4 minutes in a convection oven to manufacture a specimen. FIGS. 3 and 4 are scanning electron microscope (SEM) images of cross section and surface of a circuit electrode formed according to example 2, respectively. As shown in FIG. 3, carbon nanotubes were distributed in the silver nanoparticles to form a denser electrical network. Further, as shown in FIG. 4, metallization was accomplished under the sintering conditions of example 2.

EXAMPLE 3

Paste Containing Silver Nanoparticles and Carbon Nanotubes

An Ag—CNT paste was prepared in the same way as example 1, except that 7 g of silver nanoparticles, 10 g of butyl acetate solution containing nitrocellulose (the solid content of nitrocellulose is 3 g), 2 g of carbon nanotubes and 58 g of silver microparticles were used, and 23 g of butyl carbitol acetate (BCA) was added. A substrate was sintered at 150~° C. for 5 minutes in a convection oven to manufacture a specimen.

COMPARATIVE EXAMPLE 1

Paste Containing Only Silver Microparticles

A conductive paste was prepared by mixing a polyurethane binder with 49 to 66 weight % of silver flake-type microparticles (SF-15ED of Ferro Co.) having 1 to 3 μm based on the total weight of the conductive paste, and drying them. The conductive paste was hot-pressed using a hot press to manufacture a specimen.

COMPARATIVE EXAMPLE 2

Paste Containing Only Silver Nanoparticles

A conductive paste was prepared in the same way as example 1, except that 70 g of silver nanoparticles and 30 g of butyl acetate solution containing nitrocellulose (the solid content of nitrocellulose is 5 g) were used, and carbon nanotubes were not added.

COMPARATIVE EXAMPLE 3

Paste containing only carbon nanotubes

A conductive paste was prepared in the same way as example 1, except that 0.2 weight % of carbon nanotubes were used as a conductive material and silver microparticles were not added.

Table 1 shows the thickness of circuit wires formed using the pastes of examples and comparative examples.

Method for Measuring a Specific Resistivity

A specific resistivity was measured using area and thickness by means of a 4-probe tester (LORESTA-GP of Mitsubishi Chemical in Japan) according to the ASTM D 991 specifications. This test was performed by a test method suggested on the operating manual of the tester of Mitsubishi Chemical. Specifically, a surface resistivity was measured and multiplied by a film thickness of the specimen, and the obtained value was determined as a specific resistivity characterized by the ASTM D 991 specifications.

TABLE 1

|  | Thickness of circuit wire (μm) | Sintering temperature (° C./min) | Silver content (weight %) | CNT content (weight %) | Binder content (weight %) | Solvent content (weight %) | Specific resistance (Ω · cm) |
| --- | --- | --- | --- | --- | --- | --- | --- |
| Example 1 | 3.1 | 150/10 | 5 | 1 | 4 (NC) | 30 | $8.1 \times 10^{-6}$ |
| Example 2 | 3.2 | 140/4 | 10 | 1 | 2.4 (NC) | 28.6 | $6 \times 10^{-6}$ |
| Example 3 | 3.1 | 150/5 | 7 | 2 | 3 (NC) | 30 | $7 \times 10^{-6}$ |
| Comparative example 1 | 200 | Impossible to sinter at low temperature | 66 | 0 | 34 (PU) | 0 | $\sim 10^{12}$ |
| Comparative example 2 | 3.3 | 150/5 | 70 | 0 | 9 (NC) | 21 | $8.5 \times 10^{-6}$ |
| Comparative example 3 | 200 | Impossible to sinter at low temperature | 0 | 0.2 | 99.8 (PU) | 0 | $2.81 \times 10^{5}$ |

Note:
NC is nitrocellulose, and
PU is polyurethane

As the conductive paste of comparative example 1 contains solely silver particles having a micrometer level of particle size, the conductive paste of comparative example 1 cannot be sintered at a low temperature. The conductive paste of comparative example 1 has a specific resistivity of $\sim 10^{12}$ Ω·cm, which falls in the specific resistivity range of an insulator. That is, the conductive paste of comparative example 1, in which 49 to 66 weight % of silver microparticles solely are included as a conductive filler, cannot form a continuous electrical network. The specific resistivity of comparative example 1 is higher than a specific resistivity, $10^5$ Ω·cm of the paste of experimental example shown in FIG. 2, in which solely carbon nanotubes are included as a conductive filler. Thus, the content of silver more than 66 weight % is needed to form a continuous electrical network. Meanwhile, the conductive paste of comparative example 2 is a conventional conductive paste containing silver nanoparticles as the sole conductor. The conductive paste of comparative example 2 has a good specific resistivity of $8.5 \times 10^{-6}$ Ω·cm, but contains 70 weight % of silver nanoparticles for a high electrical conductivity. Because silver nanoparticles are more expensive than silver microparticles, this high content of silver nanoparticles is not preferable in consideration of economical efficiency for commercialization.

The conductive paste of comparative example 1 contains 66 weight % of silver microparticles, but shows characteristics of an insulator. On the contrary, the conductive paste of comparative example 3 contains 0.2 weight % of carbon nanotubes without silver microparticles, but forms a certain level of conductive network. This means that carbon nanotubes are superior to silver microparticles in forming a conductive network. However, the desired specific resistivity of $10^{-6}$ Ω·cm could not be achieved with carbon nanotubes only. Meanwhile, the conductive pastes of examples 1 to 3 have a low silver content of 5 to 10 weight %, but have a specific resistivity of 6 to $8 \times 10^{-6}$ Ω·cm, and thus may achieve a higher level of electrical conductivity than conventional pastes. Further, the conductive pastes of examples 1 to 3 can be sintered at a low temperature of 140 to 150° C., at which conventional pastes containing solely silver microparticles cannot be sintered.

According to teachings above, there is provided a conductive paste containing silver that may have relatively less restrictive requirements in the particle size of silver, a lower sintering temperature than conventional pastes, and a high electrical conductivity with a low silver content.

According to teachings above, there is provided a conductive paste containing silver that may contain silver microparticles in addition to silver nanoparticles. The conductive paste may be sintered at a temperature of 150° C. or less, resulting in good processability. Further, the conductive paste contains carbon nanotubes, and thus may reduce a usage amount of silver, compared with conventional pastes, resulting in improved economical efficiency while achieving a high electrical conductivity. With the carbon nanotubes, the conductive paste may have an improvement in adhesion with a circuit board material and is easy to control its viscosity to a suitable level for printing, due to a bridging effect as a filler. For screen printing, the conductive paste should have viscosity and thixotropy of a certain level or greater. The carbon nanotubes may provide these characteristics to the conductive paste with a small amount.

According to teaching above, there is provided a conductive paste that may be widely used to form a circuit wire by printing. For example, the conductive paste may be used to form circuit wires for printed circuit boards and display devices such as a liquid crystal display, a plasma display panel, an organic light-emitting diode and so on, to manufacture an antenna for a radio-frequency identification (RFID) system, to produce an electrode for a solar cell, and to form a reflective film for a solar cell and so on.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A conductive paste for forming a circuit wire containing silver nanoparticles, comprising:
    15 to 35 weight % of silver nanoparticles based on a total weight of the conductive paste, the silver nanoparticles having an average particle size of 1 to 100 nm;
    0.1 to 2.5 weight % of carbon nanotubes based on the total weight of the conductive paste, the carbon nanotubes having an average diameter of 2 to 40 nm;
    0.1 to 10 weight % of at least one additive based on the total weight of the conductive paste, the at least one additive being selected from the group consisting of a stabilizer, a dispersant, a reducing agent, a surfactant, a wetting agent, a thixotropic agent, a leveling agent, an antifoaming agent, a coupling agent, a surface tension adjusting agent and a thickener;
    1 to 15 weight % of a binder based on the total weight of the conductive paste; and
    a solvent, wherein
    the conductive paste enables completely fusing a sintering temperature of 150° C. or less and has a specific resistivity of $2 \times 10^{-6}$ to $10 \times 10^{-6}$ $\Omega \cdot cm$.

2. The conductive paste for forming a circuit wire containing silver nanoparticles according to claim 1, wherein the carbon nanotubes have an average length of 5 to 50μm.

3. The conductive paste for forming a circuit wire containing silver nanoparticles according to claim 1, wherein the carbon nanotubes are included at an amount of 0.5 to 1 weight % based on the total weight of the conductive paste.

4. The conductive paste for forming a circuit wire containing silver nanoparticles according to claim 1, wherein the binder is selected from the group consisting of nitrocellulose, acrylic resin, vinylic resin, ethylcellulose and modified resins thereof.

5. A conductive circuit board having a circuit wire formed from the conductive paste defined in claim 1.

* * * * *